United States Patent
Su

(10) Patent No.: US 8,629,563 B2
(45) Date of Patent: Jan. 14, 2014

(54) METHOD FOR PACKAGING SEMICONDUCTOR DIES HAVING THROUGH-SILICON VIAS

(75) Inventor: Chao-Yuan Su, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 168 days.

(21) Appl. No.: 13/368,999

(22) Filed: Feb. 8, 2012

(65) Prior Publication Data

US 2012/0146238 A1 Jun. 14, 2012

Related U.S. Application Data

(60) Continuation of application No. 12/883,910, filed on Sep. 16, 2010, now Pat. No. 8,124,458, which is a division of application No. 11/778,511, filed on Jul. 16, 2007, now Pat. No. 7,825,517.

(51) Int. Cl.
*H01L 23/52* (2006.01)
*H01L 23/48* (2006.01)
*H01L 29/40* (2006.01)

(52) U.S. Cl.
CPC ................................ *H01L 23/52* (2013.01)
USPC .................. 257/774; 257/E23.191; 257/698; 438/118

(58) Field of Classification Search
CPC .......... H01L 23/52; H01L 23/48; H01L 29/40
USPC ............ 257/E23.18, E23.181, 668, 679, 686, 257/698, 774, 777; 438/114, 118; 428/332, 428/343
See application file for complete search history.

(56) References Cited

U.S. PATENT DOCUMENTS

| | | | |
|---|---|---|---|
| 5,391,917 A | 2/1995 | Gilmour et al. | 257/690 |
| 5,510,298 A | 4/1996 | Redwine | 437/203 |
| 5,767,001 A | 6/1998 | Bertagnolli et al. | 438/455 |
| 5,998,292 A | 12/1999 | Black et al. | 438/618 |
| 6,184,060 B1 | 2/2001 | Siniaguine | 438/106 |
| 6,322,903 B1 | 11/2001 | Siniaguine et al. | 428/617 |
| 6,429,096 B1 | 8/2002 | Yanagida | |
| 6,448,168 B1 | 9/2002 | Rao et al. | 438/598 |
| 6,465,892 B1 | 10/2002 | Suga | 257/777 |
| 6,472,293 B1 | 10/2002 | Suga | 438/455 |
| 6,498,381 B2 * | 12/2002 | Halahan et al. | 257/449 |
| 6,538,333 B2 | 3/2003 | Kong | 257/777 |
| 6,599,778 B2 | 7/2003 | Pogge et al. | 438/118 |
| 6,639,303 B2 | 10/2003 | Siniaguine | 257/621 |

(Continued)

FOREIGN PATENT DOCUMENTS

| | | |
|---|---|---|
| CN | 1591884 | 3/2005 |
| CN | 1937216 | 3/2007 |
| JP | 2006-12737 | 1/2006 |

*Primary Examiner* — Chris Chu
(74) *Attorney, Agent, or Firm* — Slater & Matsil, L.L.P.

(57) ABSTRACT

Integrated circuit structures and methods are provided. According to an embodiment, a circuit structure includes a die and an anisotropic conducting film (ACF). The die comprises a through via, and the through via protrudes from a surface of the die. A cross-sectional area of the through via in the surface of the die is equal to a cross-sectional area of a protruding portion of the through via in a plane parallel to the surface of the die. The ACF adjoins the surface of the die, and the protruding portion of the through via penetrates the ACF.

20 Claims, 11 Drawing Sheets

(56) References Cited

U.S. PATENT DOCUMENTS

| | | |
|---|---|---|
| 6,664,129 B2 | 12/2003 | Siniaguine ............... 438/107 |
| 6,667,542 B2 | 12/2003 | Yamaguchi et al. |
| 6,693,361 B1 | 2/2004 | Siniaguine et al. ......... 257/777 |
| 6,740,582 B2 | 5/2004 | Siniaguine ............... 438/637 |
| 6,794,751 B2 | 9/2004 | Kumamoto |
| 6,800,930 B2 | 10/2004 | Jackson et al. ............ 257/700 |
| 6,841,883 B1 | 1/2005 | Farnworth et al. ......... 257/777 |
| 6,882,030 B2 | 4/2005 | Siniaguine ............... 257/621 |
| 6,924,551 B2 | 8/2005 | Rumer et al. ............. 257/688 |
| 6,962,867 B2 | 11/2005 | Jackson et al. ............ 438/622 |
| 6,962,872 B2 | 11/2005 | Chudzik et al. ........... 438/626 |
| 7,030,481 B2 | 4/2006 | Chudzik et al. ........... 257/700 |
| 7,049,170 B2 | 5/2006 | Savastiouk et al. ......... 438/106 |
| 7,060,601 B2 | 6/2006 | Savastiouk et al. ......... 438/584 |
| 7,071,546 B2 | 7/2006 | Fey et al. ................ 257/686 |
| 7,098,076 B2 | 8/2006 | Liu |
| 7,111,149 B2 | 9/2006 | Eilert ................... 711/220 |
| 7,122,912 B2 | 10/2006 | Matsui ................... 257/797 |
| 7,157,787 B2 | 1/2007 | Kim et al. ................ 257/621 |
| 7,169,648 B2 | 1/2007 | Sato et al. |
| 7,193,308 B2 | 3/2007 | Matsui ................... 257/686 |
| 7,262,495 B2 | 8/2007 | Chen et al. ............... 257/690 |
| 7,279,776 B2 | 10/2007 | Morimoto |
| 7,297,574 B2 | 11/2007 | Thomas et al. ............ 438/109 |
| 7,335,972 B2 | 2/2008 | Chanchani ............... 257/686 |
| 7,355,273 B2 | 4/2008 | Jackson et al. ............ 257/686 |
| 7,498,661 B2 * | 3/2009 | Matsuo ................... 257/621 |
| 7,537,959 B2 | 5/2009 | Lee et al. |
| 7,588,964 B2 * | 9/2009 | Kwon et al. .............. 438/109 |
| 7,871,925 B2 * | 1/2011 | Kim et al. ................ 438/623 |
| 7,915,080 B2 * | 3/2011 | Takahashi et al. .......... 438/108 |
| 7,943,514 B2 * | 5/2011 | West ..................... 438/667 |
| 8,154,134 B2 * | 4/2012 | Bonifield et al. ........... 257/774 |
| 8,178,976 B2 * | 5/2012 | Dunne et al. .............. 257/774 |
| 8,294,261 B2 * | 10/2012 | Mawatari et al. ........... 257/712 |
| 8,298,874 B2 * | 10/2012 | Gallegos et al. ............ 438/125 |
| 8,344,493 B2 * | 1/2013 | West et al. ............... 257/686 |
| 8,498,504 B2 * | 7/2013 | Matsubara et al. ........... 385/14 |
| 8,513,802 B2 * | 8/2013 | Ma et al. ................. 257/734 |
| 2004/0080045 A1 * | 4/2004 | Kimura et al. ............. 257/736 |
| 2007/0158787 A1 | 7/2007 | Chanchani |
| 2009/0191708 A1 * | 7/2009 | Kropewnicki et al. ....... 438/667 |
| 2009/0212438 A1 * | 8/2009 | Kreupl et al. .............. 257/773 |
| 2010/0015792 A1 * | 1/2010 | Lee et al. ................. 438/612 |

\* cited by examiner

METHOD FOR PACKAGING SEMICONDUCTOR DIES HAVING THROUGH-SILICON VIAS

This application is a continuation of and claims the benefit of U.S. patent application Ser. No. 12/883,910, filed on Sep. 16, 2010, entitled "Method for Packaging Semiconductor Dies Having Through-Silicon Vias," which is a divisional of and claims the benefit of U.S. patent application Ser. No. 11/778,511, filed on Jul. 16, 2007, entitled "Method for Packaging Semiconductor Dies Having Through-Silicon Vias;" which applications are hereby incorporated herein in their entireties by reference.

TECHNICAL FIELD

This invention relates generally to integrated circuits, and more particularly to the packaging of semiconductor dies, and even more particularly to the packaging of semiconductor dies having through-silicon vias.

BACKGROUND

Through-silicon vias (TSV), also commonly referred to as through-wafer vias (TWV), are widely used in integrated circuits. TSVs can be used for stacking dies. In stacked dies including a first die stacked on a second die, electrical connections may be made from the first die to the top surface of the second die through TSVs in the first die. TSVs are also commonly used for providing a quick and low-resistive path from a front surface of a die to its back surface.

FIGS. 1 through 3 illustrate cross-sectional views of intermediate stages in a conventional process for forming TSVs in a die and grounding the die through the TSVs. Referring to FIG. 1, TSVs 12 are formed in die 10, and extend from substantially the front surface (the top surface) of die 10 into substrate 14, which are typically formed of silicon. TSVs 12 may be used to provide a grounding path for integrated circuit in die 10. Due to process variations, TSVs 12 may have different lengths L.

In FIG. 2, the back surface of die 10 is polished using a slurry that attacks silicon. To ensure all TSVs 12 are exposed through the back surface, silicon substrate 14 may have to be polished to a level so that at least some of the TSVs 12 slightly protrude out of the back surface. Due to the different lengths L of TSVs 12, some of the TSVs 12 will protrude more than others.

In FIG. 3, die 10 is mounted on substrate 16, which may be a lead-frame or other types of package substrates, through silver paste 18. Typically, silver paste 18 is in liquid form, and is applied on substrate 16, followed by pressing die 10 against silver paste 18. Silver paste 18 is conductive, and hence electrically interconnecting TSVs 12. Die 10 is thus grounded through TSVs 12. Since TSVs 12 may protrude out of the back surface of die 12 for different lengths L, die 10 may be tilted. This causes reliability issues. For example, after the formation of wire bonds, molding compound 20 will be applied. Due to the tilting of die 10, some portion of the wire bonds, for example, wire 22, may not be fully covered by molding compound 20, and hence is subject to mechanical damage.

One way to solve the above-discussed problem is to polish back the protruded TSVs 12 after the polishing of silicon substrate 14. However, since TSVs 12, which are typically formed of copper, need different slurries than silicon substrate 14, an additional polishing process is needed. Further, the process for polishing copper is more costly than polishing silicon due to contamination issues. Therefore, polishing back TSVs is a undesirable solution. Accordingly, new methods for packaging dies on substrates without causing the above-discussed problem are needed.

SUMMARY

In accordance with one aspect of the present invention, an integrated circuit structure is provided. The integrated circuit structure includes a die and an anisotropic conducing film (ACF) adjoins the back surface of the die. The die includes a front surface; a back surface on an opposite side of the die than the front surface; and a through-silicon via (TSV) exposed through the back surface of the die.

In accordance with another aspect of the present invention, an integrated wafer-mount tape includes a ultra-violet wafer-mount tape; and an ACF on an opposite side of the integrated wafer-mount tape than the ultra-violet wafer-mount tape.

In accordance with yet another aspect of the present invention, a method for forming a package structure includes providing a die, which includes a front surface; a back surface on an opposite side of the front surface; and a TSV exposed through the back surface of the die. The method further includes attaching an ACF to the back surface of the die, wherein the TSV penetrates into the ACF.

In accordance with yet another aspect of the present invention, a method of forming a package structure includes providing a semiconductor wafer; and providing an integrated wafer-mount tape, which includes an ultra-violet wafer-mount tape; and an ACF on an opposite side of the integrated wafer-mount tape than the ultra-violet wafer-mount tape. The method further includes attaching the semiconductor wafer to the integrated wafer-mount tape, wherein a back surface of the wafer is in contact with the ACF; sawing the semiconductor wafer to separate dies in the semiconductor wafer; exposing the ultra-violet wafer-mount tape to an ultra-violet light; detaching the ultra-violet wafer-mount tape from the ACF; and mounting a die separated from the semiconductor wafer onto a package substrate, wherein the ACF is between the die and the package substrate.

By using the ACF as the electrical interconnection layer, the difference in the protruding lengths of TSVs are absorbed, and the die may be parallel to the respective package substrate after packaging.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel packaging structure and the methods for forming the same are provided. The intermediate stages of manufacturing embodiments of the present invention are illustrated. Throughout the various views and illustrative embodiments of the present invention, like reference numbers are used to designate like elements.

Figure 1:
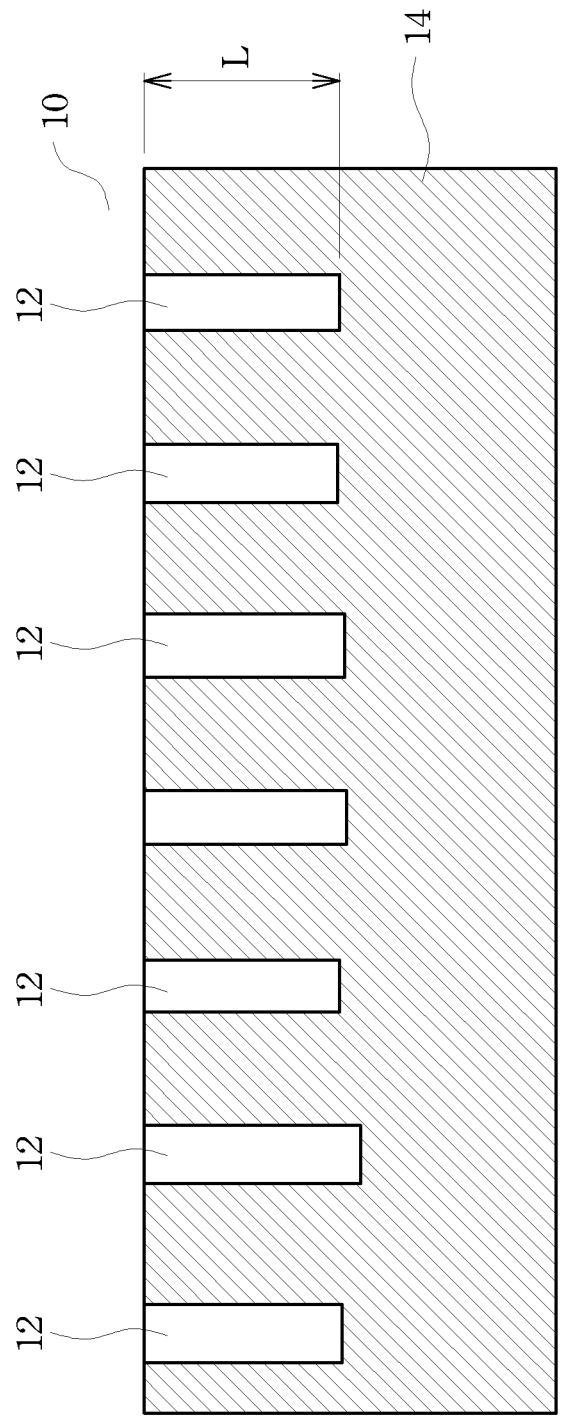
FIG. 1 through 3 are cross-sectional views of intermediate stages in the conventional manufacturing and packaging of a semiconductor die.
Figure 2:
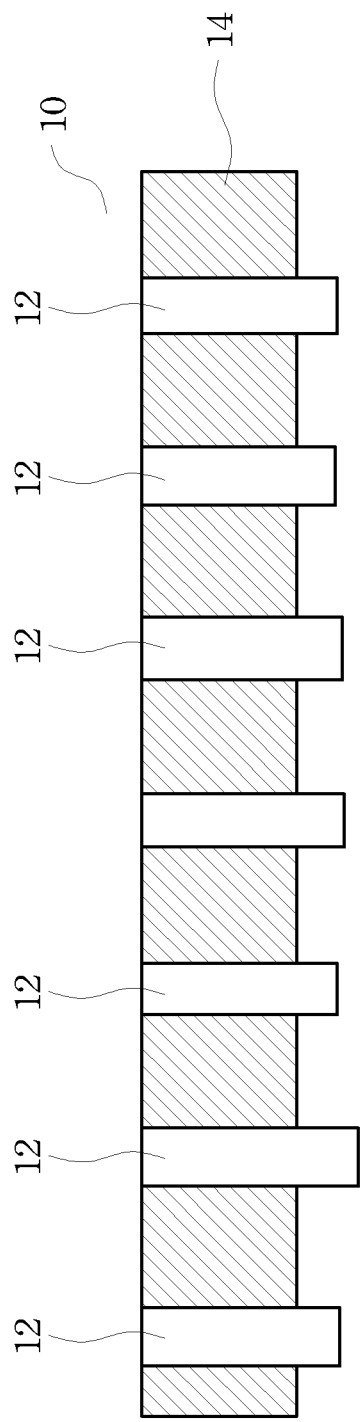
Figure 3:
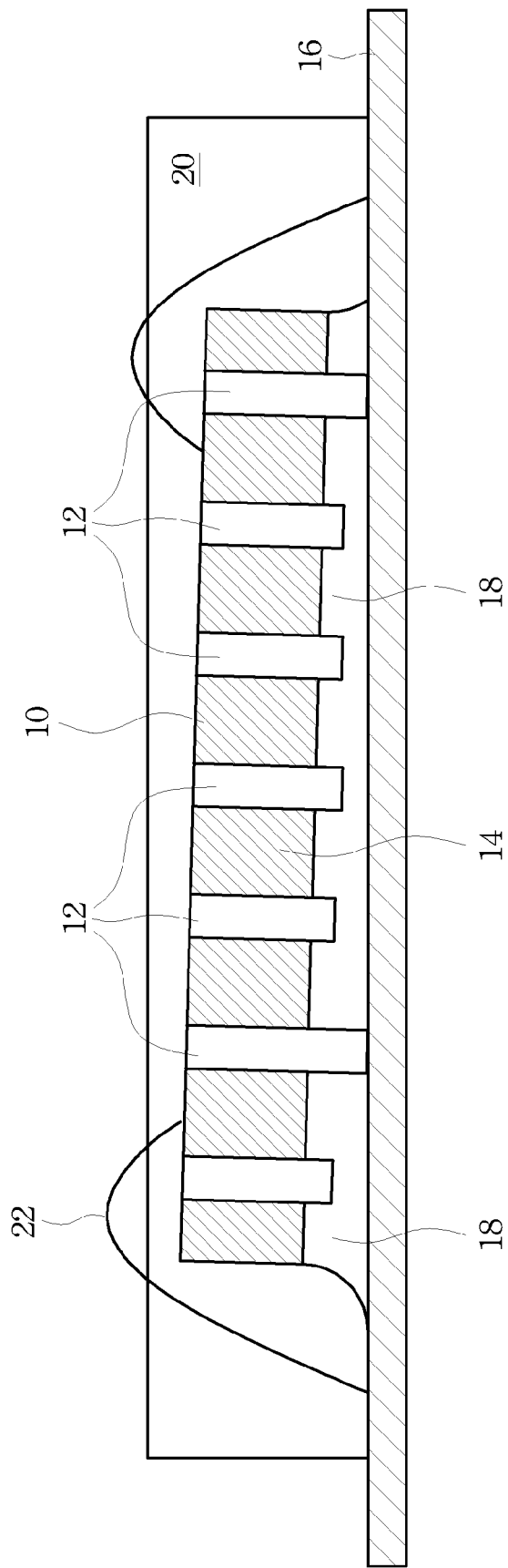
Figure 4A:
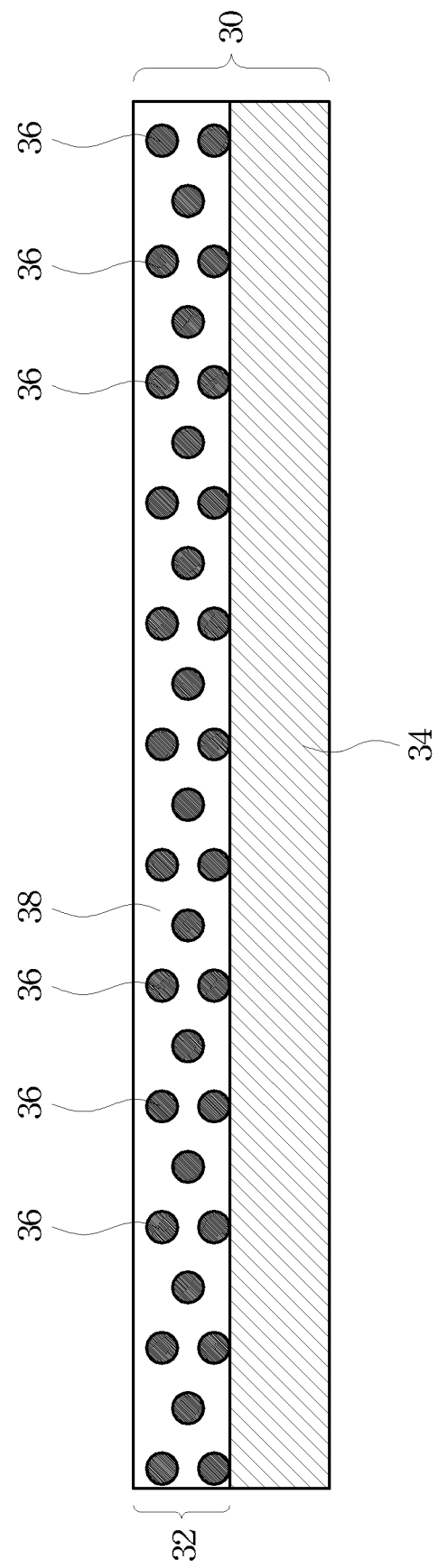
FIGS. 4 through 8 are cross-sectional views of intermediate stages in the manufacturing of an embodiment of the present invention.

FIG. 4A illustrates integrated wafer-mount tape 30, which includes anisotropic conducting film (ACF) 32 and ultraviolet (UV) wafer-mount tape 34. As is known in the art, ACF 32 includes a plurality of conductive particles 36 insulated from each other by non-conductive base material 38, which may include epoxies. Each of the conductive particles 36 may be polymer spheres coated with conductive materials, for example, nickel and gold. The insulated conductive particles 36 are distributed in such a way that their incidental contacts are low. Accordingly, conductive particles 36 may be embedded in base material 38 in the form of matrixes. In an exemplary embodiment, ACF 32 has a thickness of between about 25 μm and about 75 μm. The thickness of ACF 32 needs to be greater than the lengths of the protruded portions of TSVs 46 (refer to FIG. 7A). The details are discussed in subsequent paragraphs.

Figure 4B:
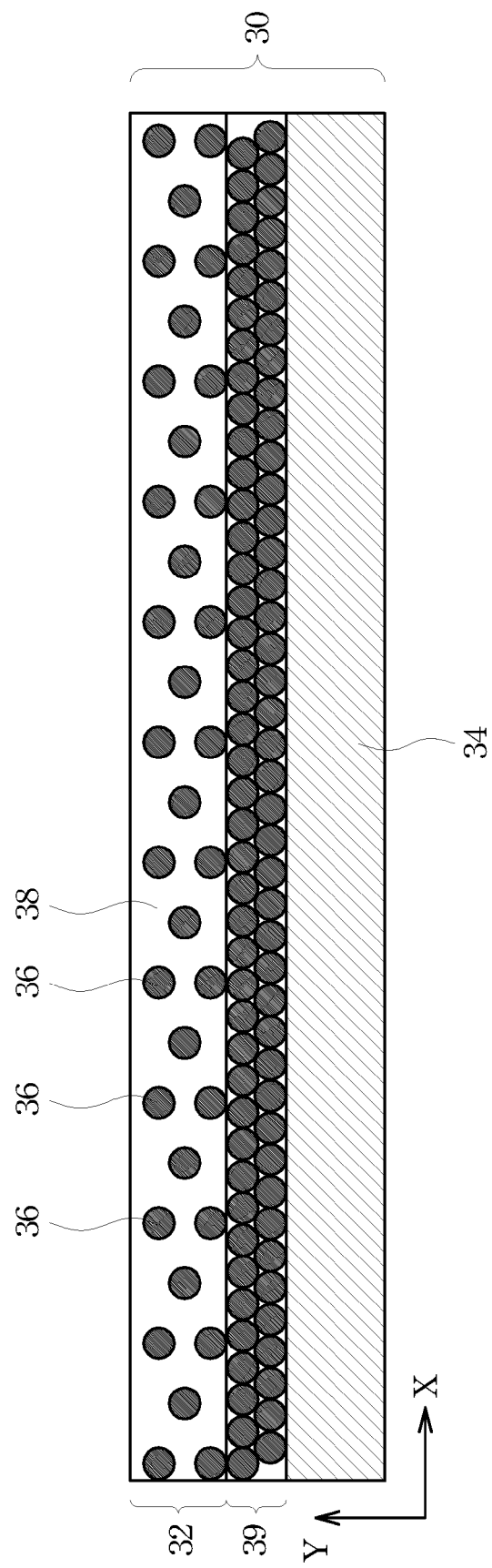

UV wafer-mount tape 34 is adhesive, and may lose its adhesive characteristic when exposed to UV light. In an embodiment, ACF 32 and UV wafer-mount tape 34 are in contact with each other, as is shown in FIG. 4A. In alternative embodiment, as is shown in FIG. 4B, a conductive layer 39, which is preferably flexible, may be formed between ACF 32 and UV wafer-mount tape 34. In an exemplary embodiment, conductive layer 39 is formed of similar materials as ACF 32, except the density of the conductive particles are significantly higher than in ACF 32, so that conductive layer 39 is conductive not only in the Y-direction, but also in the X-direction. Conductive layer 39 may also be formed of other materials, such as nickel, gold, and the like.

Figure 5:
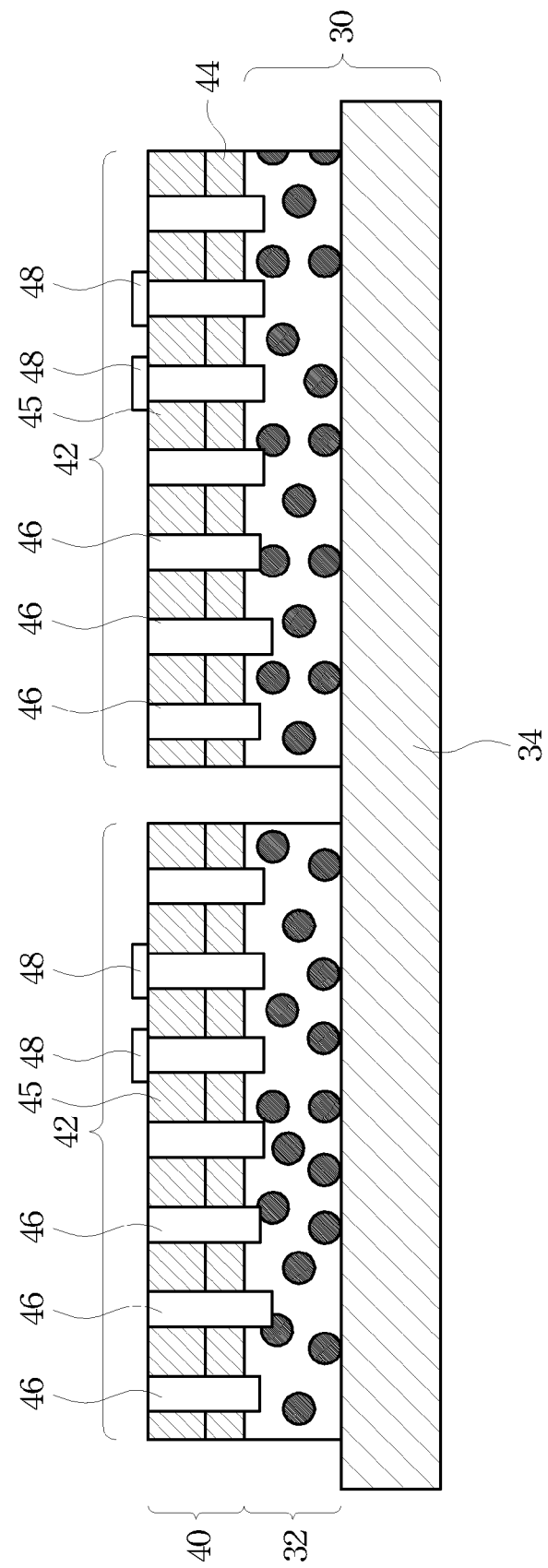

Referring to FIG. 5, wafer 40 is attached to integrated wafer-mount tape 30, with ACF 32 in contact with the backside of wafer 40. Wafer 40 includes a plurality of dies 42, each including substrate 44 and a plurality of through-silicon vias (TSV) 46. Dies 42 may further include semiconductor substrates 44, and integrated circuits formed at the front surfaces of semiconductor substrates 44. Transistors 45 are schematically illustrated to symbolize the integrated circuits (not shown). Interconnect structures, which include metal lines and vias formed in low-k dielectric layers (not shown), are formed over, and interconnecting, the integrated circuits. TSV 46 may be connected to the integrated circuits in dies 42. In an embodiment, bond pads 48 are formed on the front surface of dies 42, wherein bond pads 48 are used for connecting dies 42 to package substrates, or other dies that will be stacked on dies 42.

As is known in the art, the formation of TSVs 46 include forming via openings extending from substantially the front surface of wafer 40 into semiconductor substrate 44, and filling the openings with a conductive material, for example, copper or copper alloys. The back surface of wafer 40 is then polished to expose TSVs 46. Due to process variations, TSVs 46 may have different lengths, and thus may protrude out of the back surface of die 42 for different lengths.

When wafer 40 is attached to integrated wafer-mount tape 30, appropriate force is applied so that the protruding portions of TSVs 46 may penetrate, at least partially, into ACF 32. Wafer 40 is then sawed along the scribe lines to separate dies 42. Preferably, the kerfs extend into ACF 32, and hence ACF 32 is separated into die-size pieces also.

Figure 6:
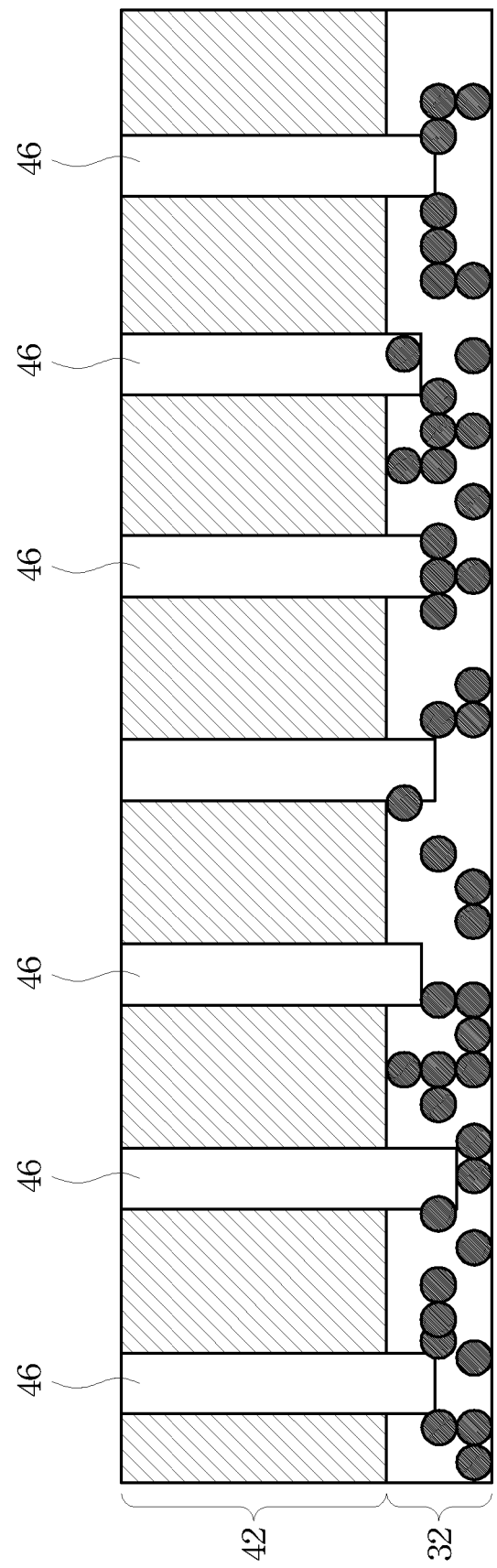

UV wafer-mount tape 34 is then exposed to UV light, and hence becoming non-adhesive. Dies 42 may thus be detached from UV wafer-mount tape 34. In the resulting structure, as is shown in FIG. 6, the backside of each of dies 42 is attached to one piece of ACF 32.

Figure 7A:
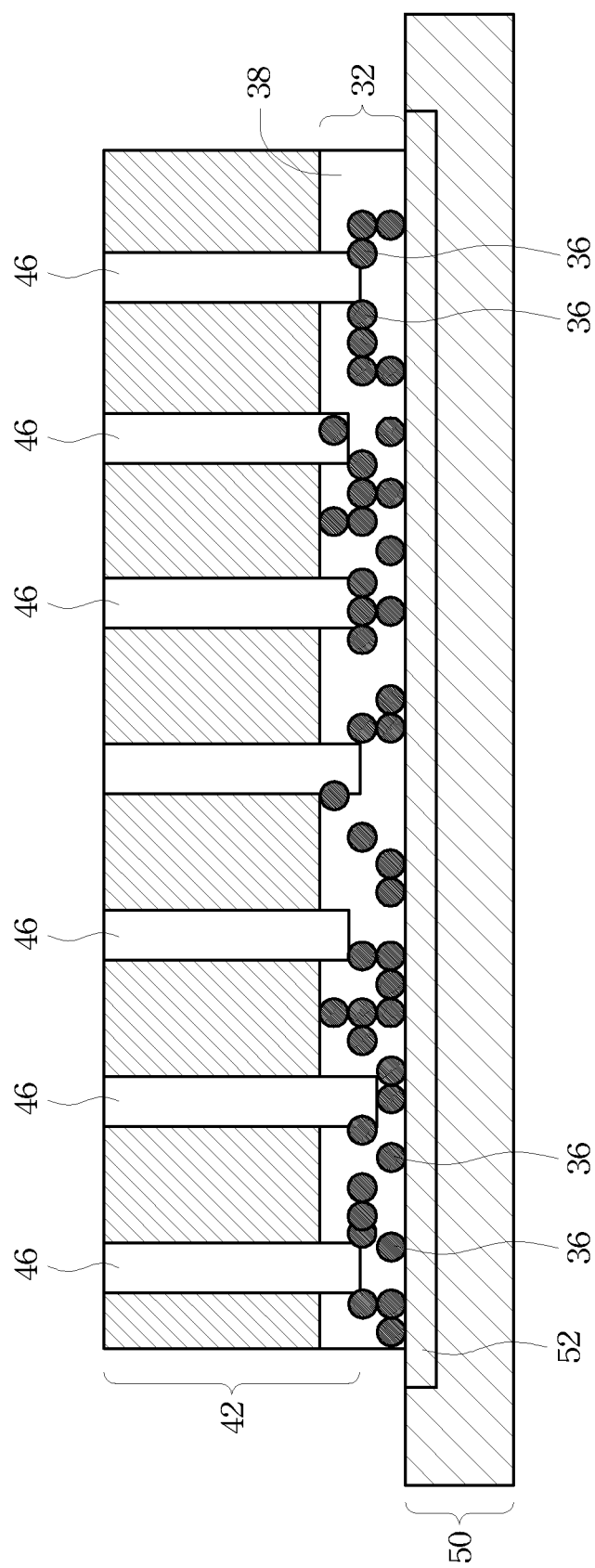

FIG. 7A illustrates the mounting of die 42 on package substrate 50. Package substrate 50 may be a bismaleimide trianzine (BT) substrate, a print circuit board (PCB), or other commonly used substrate capable of having dies packaged thereon. Alternatively, package substrate 50 is a lead-frame. Bond pads or metal leads (not shown) may be formed on the surface of package substrate, and in contact with ACF 32. In the embodiments TSVs 46 are used for grounding purpose, package substrate 50 may include a conductive layer 52 on the surface for shorting TSVs 46.

The structure as shown in FIG. 7A is then subject to pressure and heat to cure the base material 38 and to securely attach ACF 32 onto package substrate 50. Under the pressure, conductive particles 36 are trapped, while insulating material 38 is pushed away, allowing TSVs 46 to electrically connect to package substrate 50 through conductive particles 36. In an exemplary embodiment, the curing temperature is between about 150° C. and about 210°, while the desirable pressure depends on the number of TSVs 46. In the resulting structure, TSVs 46 are shorted to each other and to the ground through conductive layer 52.

Figure 7B:
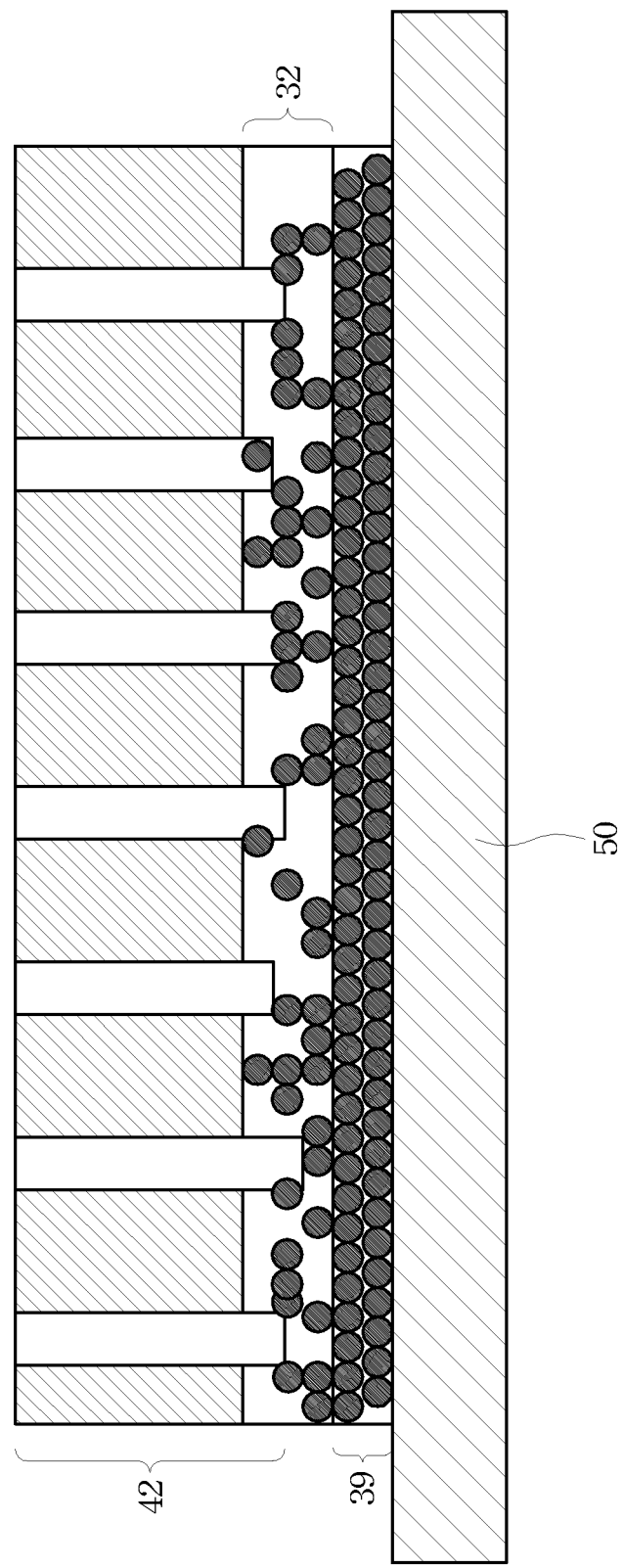

In alternative embodiments, as is shown in FIG. 7B, if the integrated wafer-mount tape 30 includes conductive layer 39, after UV wafer-mount tape 34 is removed, conductive layer 39 is left on ACF 32. As a result, TSVs 46 are shorted through conductive layer 39.

Figure 7C:
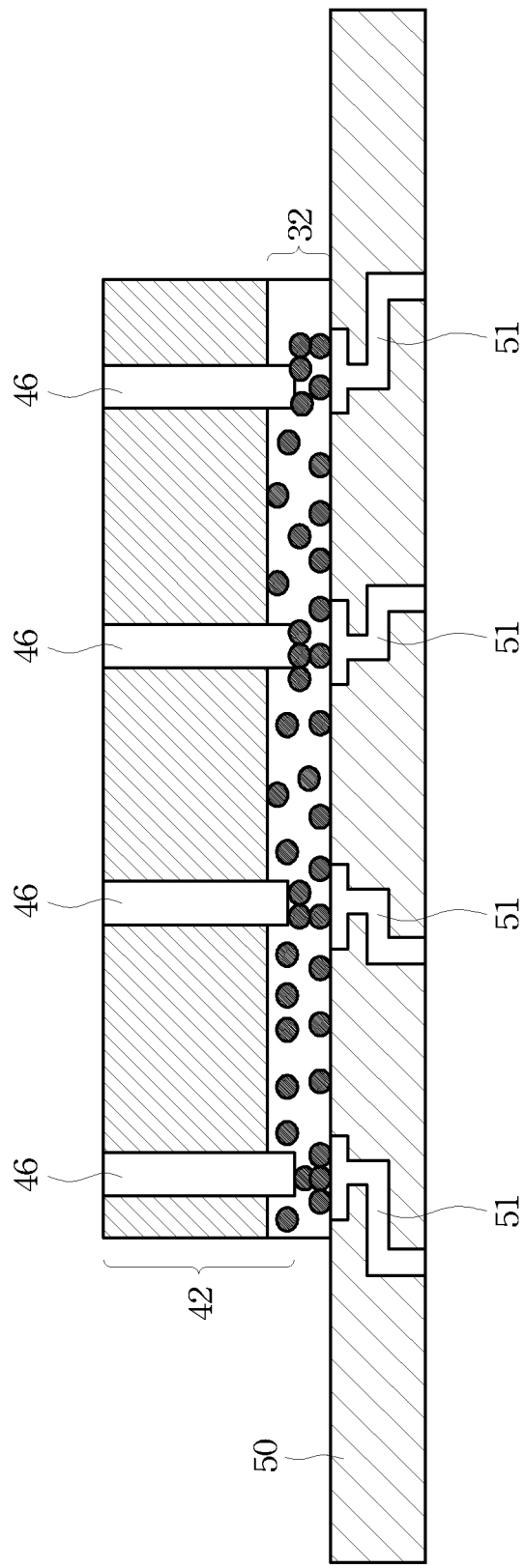

In yet other embodiments, as is shown in FIG. 7C, TSVs 46 are not used for grounding purpose. Accordingly, through ACF 32, TSVs 46 are connected to electrically-insulated bonding pads and redistribution traces 51 in package substrate 50.

Figure 8:
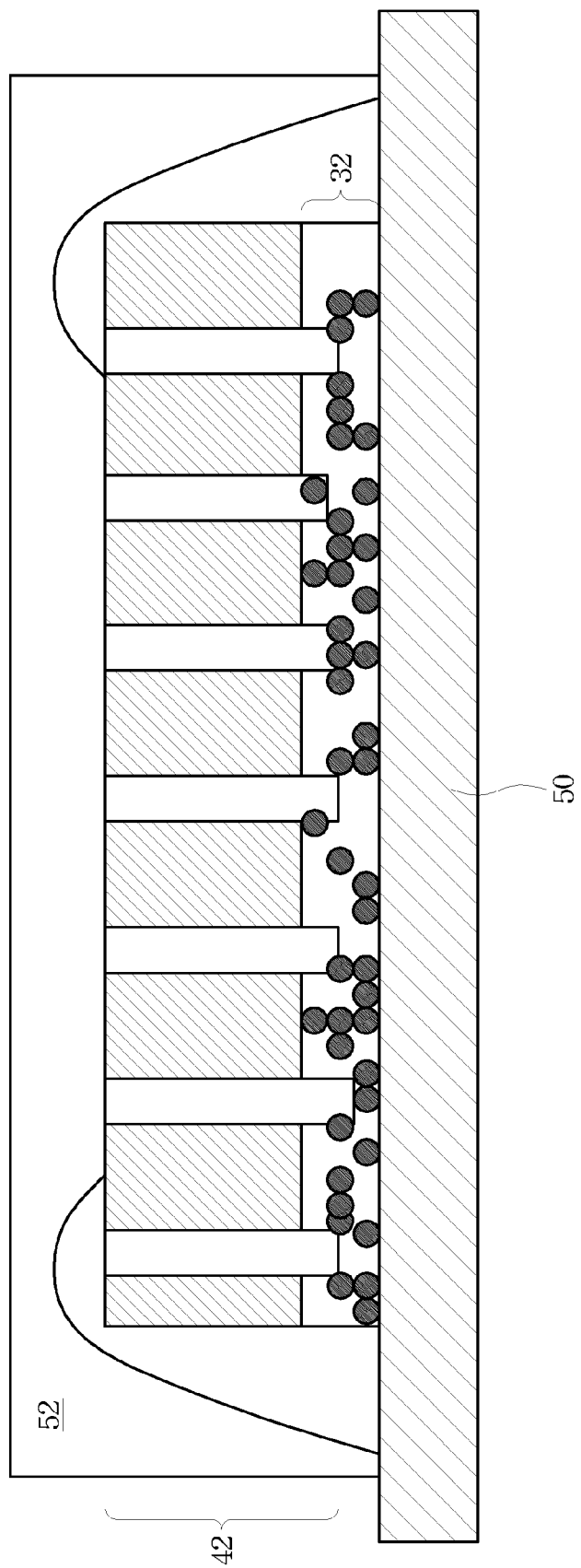

In FIG. 8, die 42 is electrically connected to package substrate 50 through wire bonding. Molding compound 52 is then formed to protect the resulting package substrate.

The embodiments of the present invention have several advantageous features. First, with ACF 32, the difference in the lengths of TSV 46 is absorbed by ACF 32. As a result, die 42 is parallel to package substrate 50. The likelihood that some portions of the resulting package are exposed through the molding compound is thus reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
a die comprising a through via, the through via protruding from a surface of the die, a cross-sectional area of the through via in the surface of the die being equal to a cross-sectional area of a protruding portion of the through via in a plane parallel to the surface of the die; and
an anisotropic conducting film (ACF) adjoining the surface of the die, the protruding portion of the through via penetrating the ACF.

2. The structure of claim 1 further comprising a package substrate, the ACF being between the package substrate and the die.

3. The structure of claim 2, wherein the ACF adjoins the package substrate.

4. The structure of claim 2, wherein the package substrate is selected from the group consisting essentially of a glass substrate, a bismaleimide trianzine substrate, a print circuit board, and a lead frame.

5. The structure of claim 2 further comprising a conductive layer between the package substrate and the ACF.

6. The structure of claim 2, wherein the package substrate comprises a conductive layer, and wherein the conductive layer is further electrically connected to an additional through via in the die and the through via.

7. The structure of claim 1, wherein the die is a portion of a wafer, and further comprising an ultra-violet wafer-mount tape adjoining the ACF, and wherein the ACF and the ultra-violet wafer-mount tape have sizes no smaller than the wafer.

8. The structure of claim 7, wherein the ACF and the ultra-violet wafer-mount tape are co-terminus, and are not co-terminus with the wafer.

9. A method comprising:
forming a through via through a first surface of a substrate;
after the forming the through via, causing the through via to protrude from a second surface of the substrate, the second surface of the substrate being opposite from the first surface of the substrate; and
attaching an anisotropic conducting film (ACF) to the second surface of the substrate, a protruding portion of the through via penetrating into the ACF, the ACF being a part of a wafer-mount tape.

10. The method of claim 9, wherein the causing the through via to protrude from the second surface of the substrate includes polishing the second surface of the substrate.

11. The method of claim 9 further comprising:
sawing the substrate; and
detaching singulated portions of the substrate from the wafer-mount tape, the singulated portions of the substrate having respective singulated portions of the ACF attached thereto.

12. The method of claim 9 further comprising attaching at least a portion of the substrate and at least a portion of the ACF to a package substrate, the portion of the substrate comprising the through via, the ACF being disposed between the portion of the substrate and the package substrate.

13. The method of claim 12, wherein the ACF electrically couples the through via to a feature on the package substrate.

14. The method of claim 9, wherein the wafer-mount tape comprises an ultra-violet wafer-mount tape, the ACF being on an opposite side of the wafer-mount tape than the ultra-violet wafer-mount tape.

15. The method of claim 14 further comprising detaching at least a portion of the substrate from the wafer-mount tape by exposing the ultra-violet wafer-mount tape to an ultra-violet light, at least a portion of the ACF remaining attached to the portion of the substrate.

16. The method of claim 9, wherein the wafer-mount tape comprises an electrically conductive layer, the ACF being between the substrate and the electrically conductive layer.

17. A method of forming a package structure, the method comprising:
attaching a wafer to a wafer-mount tape, the wafer-mount tape comprising an ultra-violet wafer-mount tape and an anisotropic conducting film (ACF), a first surface of the wafer being in contact with the ACF;
singulating the wafer to separate dies;
exposing the ultra-violet wafer-mount tape to an ultra-violet light;
detaching the ultra-violet wafer-mount tape from the ACF; and
mounting a die separated from the wafer onto a package substrate, the ACF being between the die and the package substrate.

18. The method of claim 17, wherein the die comprises a through via protruding out of a back surface of the die, and wherein in the step of mounting the die, the through via penetrates into the ACF.

19. The method of claim 18, wherein the die comprises a plurality of through vias, wherein at least two of the through vias protrude out of the back surface of the die for different lengths.

20. The method of claim 17, wherein the wafer-mount tape further comprises a conductive layer between the ACF and the ultra-violet wafer-mount tape, and wherein after the step of detaching the ultra-violet wafer-mount tape from the ACF, the conductive layer is attached to the ACF.

* * * * *